(12) United States Patent
Arell

(10) Patent No.: US 8,737,520 B1
(45) Date of Patent: May 27, 2014

(54) RF DIRECTIONAL COUPLED OUTPUT FROM A QUADRATURE COMBINED AMPLIFIER

(75) Inventor: Thomas W. Arell, Basking Ridge, NJ (US)

(73) Assignee: Anadigics, Inc., Warren, NJ (US)

( * ) Notice: Subject to any disclaimer, the term of this patent is extended or adjusted under 35 U.S.C. 154(b) by 107 days.

(21) Appl. No.: 13/398,011

(22) Filed: Feb. 16, 2012

Related U.S. Application Data

(60) Provisional application No. 61/444,000, filed on Feb. 17, 2011.

(51) Int. Cl.
*H04L 27/00* (2006.01)

(52) U.S. Cl.
USPC .......................................... 375/295; 330/107

(58) Field of Classification Search
USPC ........................................... 375/295; 330/107
See application file for complete search history.

(56) References Cited

U.S. PATENT DOCUMENTS

| | | | |
|---|---|---|---|
| 6,122,085 A * | 9/2000 | Bitler | 398/193 |
| 6,268,768 B1 * | 7/2001 | Blodgett | 330/107 |
| 2008/0180190 A1 * | 7/2008 | Chan et al. | 333/118 |
| 2012/0112808 A1 * | 5/2012 | Yotsuji | 327/156 |

OTHER PUBLICATIONS

Arthur, Thomas; "RF Integrated Passive Devices: The Next Big, Small Thing," Microwave Journal; Nov. 2011, vol. 54, Issue 11, 2 pages.

* cited by examiner

*Primary Examiner* — Chieh M Fan
*Assistant Examiner* — Tanmay Shah
(74) *Attorney, Agent, or Firm* — William L. Botjer

(57) ABSTRACT

A radio frequency (RF) coupling circuit for coupling an RF output of a quadrature combined amplifier. According to an embodiment, the RF coupling circuit includes a phase shifting component and a coupling network. The phase shifting component provides a predetermined phase shift to an RF signal at a first output terminal of the quadrature combined amplifier. The coupling network combines the phase shifted first output signal with an RF signal at a second output terminal of the quadrature combined amplifier.

19 Claims, 5 Drawing Sheets

RF DIRECTIONAL COUPLED OUTPUT FROM A QUADRATURE COMBINED AMPLIFIER

CROSS REFERENCE TO RELATED APPLICATION

This application claims priority from U.S. provisional application No. 61/444,000 titled: "RF Directional Coupled Output from a Quadrature Combined Amplifier" filed Feb. 17, 2011 the disclosure of which is hereby incorporated by reference.

TECHNICAL FIELD

The present invention generally relates to the field of a quadrature combined amplifier. More specifically, it relates to a circuit arrangement for obtaining a radio frequency (RF) coupled output from the quadrature combined amplifier.

BACKGROUND

Quadrature combined amplifiers are widely used in power amplification applications in microwave and radio frequency (RF) spectrum. The advantage of the quadrature combined amplifier is that optimum impedance matching can be done for low noise, gain flatness, and power and linearity while the input and output return loss (VSWR) will be good as long as the two single ended amplifiers (within the quadrature amplifier) are identical. Quadrature combined amplifiers are also commonly used rather than single ended amplifiers for multiple cascaded stages due to the low interaction and enhanced stability because of the good input and output return loss. Also, the quadrature combined amplifier is less sensitive to load mismatch and more reliable in operation than the single ended amplifier. Furthermore, there are a variety of other application areas where the quadrature combined amplifier is used, such as, microwave heating, driving another high power source, driving a transmitting antenna, exciting resonant cavity structures, and so forth.

Existing RF amplifying systems based on quadrature combined amplifiers use a directional coupler to obtain an RF coupled output with directivity. The directional coupler is bulky and may have an undesirable impact on the size and the overall cost of the RF amplifying system. In light of the above, there is a need of a system that reduces overall size and cost of the RF amplifying system.

SUMMARY

Various embodiments of the invention provide an RF coupling circuit for coupling an RF output of a quadrature combined amplifier. In an embodiment, the RF coupling circuit includes a phase shifting component having a first terminal and a second terminal. The first terminal of the phase shifting component is connected to a first output terminal of the quadrature combined amplifier. The phase shifting component provides a predetermined phase shift to a first RF signal at the first output terminal of the quadrature combined amplifier. The phase shifted first RF signal is obtained at the second terminal of the phase shifting component.

The RF coupling circuit further includes a coupling network for obtaining an RF coupled output. The coupling network has a first terminal, a second terminal, and a third terminal. The first terminal of the coupling network receives a second RF signal from a second output terminal of the quadrature combined amplifier. The second terminal of the coupling network receives the phase shifted first RF signal from the second terminal of the phase shifting component. The RF coupled output is obtained at the third terminal of the coupling network.

BRIEF DESCRIPTION OF DRAWINGS

The detailed description of the embodiments will hereinafter be described in conjunction with the appended drawings provided to illustrate and not to limit the invention, wherein like designations denote like elements, and in which.

DETAILED DESCRIPTION

The invention can be best understood with reference to the detailed figures and description set forth herein. Various embodiments are discussed below with reference to the figures. However, those skilled in the art will readily appreciate that the detailed description given herein with respect to these figures is just for explanatory purposes. The disclosed systems extend beyond the described embodiments. For example, those skilled in the art will appreciate that in light of the teachings presented, multiple alternate and suitable approaches may be realized, to implement the functionality of any detail described herein, beyond the particular implementation choices in the following embodiments described and shown.

Figure 1:
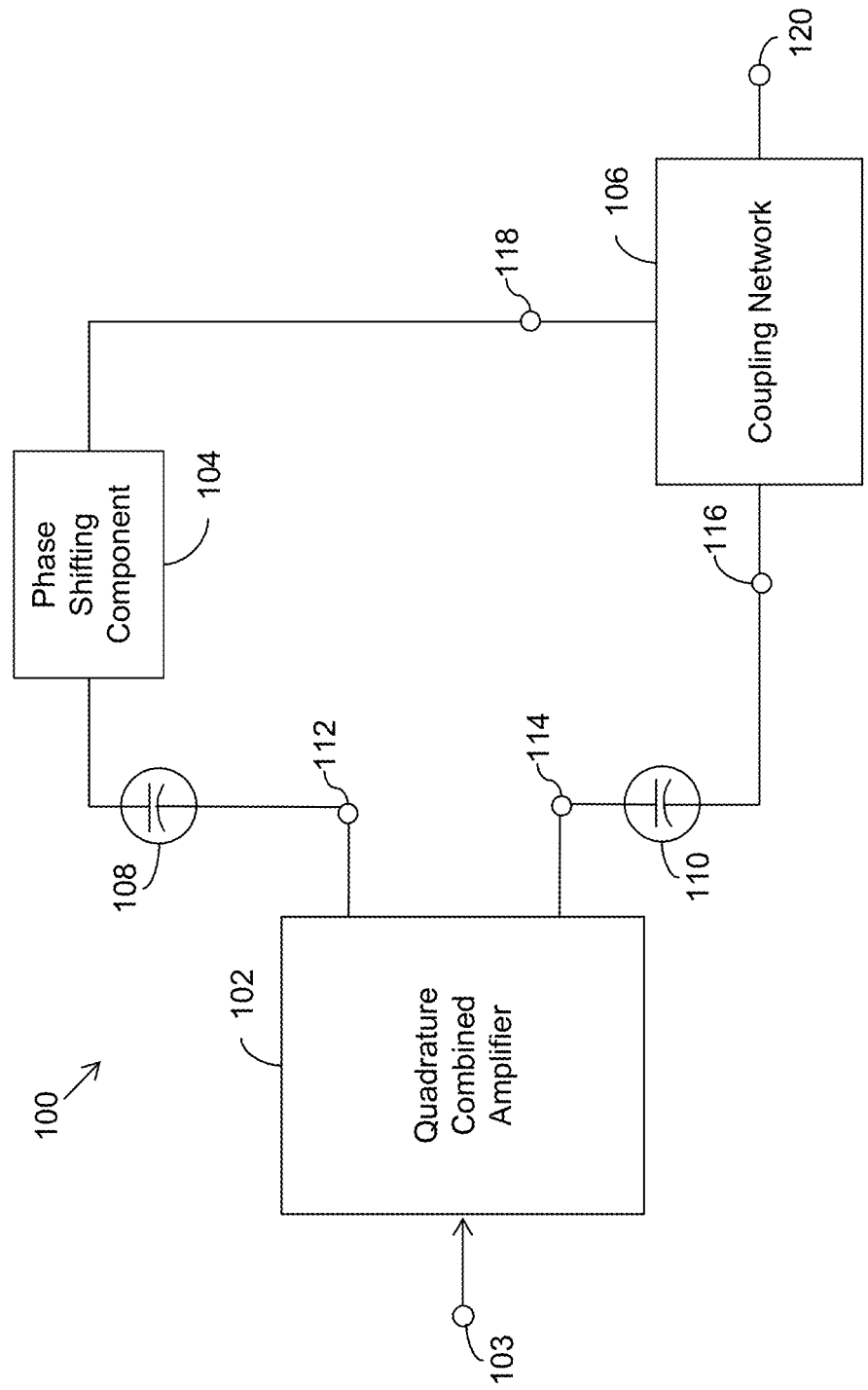
FIG. 1 is a block diagram of an RF amplifying system in accordance with an embodiment.

Various embodiments of the invention provide an RF amplifying system for providing an RF output with directivity with overall reduced size, insertion loss, and cost of the RF amplifying system. The RF amplifying system includes a quadrature combined amplifier and an RF coupling circuit coupled to the quadrature combined amplifier. The RF coupling circuit provides an RF coupled output with directivity. FIG. 1 is a block diagram of an RF amplifying system 100 in accordance with an embodiment of the invention. RF amplifying system 100 includes a quadrature combined amplifier 102, a phase shifting component 104, a coupling network 106, a first coupling element in the form of a capacitor 108, and a second coupling element in the form of a capacitor 110.

Quadrature combined amplifier 102 has an input terminal 103, a first output terminal 112, and a second output terminal 114. A first terminal of phase shifting component 104 is connected to first output terminal 112 through a first coupling capacitor 108. It is apparent to a person of ordinary skill in the art that the first terminal of phase shifting component 104 may also be directly connected to first output terminal 112, without departing from the scope of the ongoing description. Coupling network 106 has three terminals, in which, a first terminal 116 is connected to second output terminal 114 through second coupling capacitor 110, a second terminal 118 is connected to a second terminal of phase shifting component 104, and a third terminal 120 is used to obtain an RF coupled output. It is also apparent to a person of ordinary skill in the art that second terminal 118 of coupling network 106 may also be directly connected to second output terminal 114 of quadrature combined amplifier 102, without departing from the scope of the ongoing description.

Quadrature combined amplifier 102 receives an RF signal at input terminal 103. The RF signal is internally divided into an in-phase component and a quadrature component. The in-phase component and the quadrature component are amplified by quadrature combined amplifier 102. The amplified in-phase component (which is hereinafter referred to as first RF signal) is obtained at first output terminal 112 of quadrature combined amplifier 102. The amplified quadrature component (hereinafter referred to as a second RF signal) is obtained at second output terminal 114 of quadrature combined amplifier 102. It is understood by any person of ordinary skill in the art that the second RF signal is ninety degrees out of phase with respect to the first RF signal. Further, the functionality of quadrature combined amplifier 102 will be explained in detail in conjunction with FIG. 2.

Phase shifting component 104 receives the first RF signal from first output terminal 112. Phase shifting component 104 provides a predetermined phase shift to the first RF signal. In an embodiment, phase shifting component 104 provides a ninety degrees phase shift to the first RF signal. The phase shifted first RF signal is obtained at the second terminal of phase shifting component 104. Various examples of phase shifting component 104, may include, but are not limited to a transmission line, a low pass filter, an all pass filter, or a lumped equivalent of the transmission line. The lumped equivalent of the transmission line may include one or more inductors and/or one or more capacitors.

Coupling network 106 receives the second RF signal at first terminal 116 from second output terminal 114. Coupling network 106 also receives the phase shifted first RF signal at second terminal 118 from the second terminal of phase shifting component 104. In an embodiment of the invention, coupling network 106 combines the phase shifted first RF signal and the second RF signal to provide the RF coupled output at third terminal 120. In another embodiment of the invention, coupling network 106 sums the phase shifted first RF signal and the second RF signal to provide the RF coupled output at third terminal 120. In an embodiment, coupling network 106 includes a plurality of resistors. Coupling network 106 will further be explained in conjunction with FIG. 2.

Figure 2:
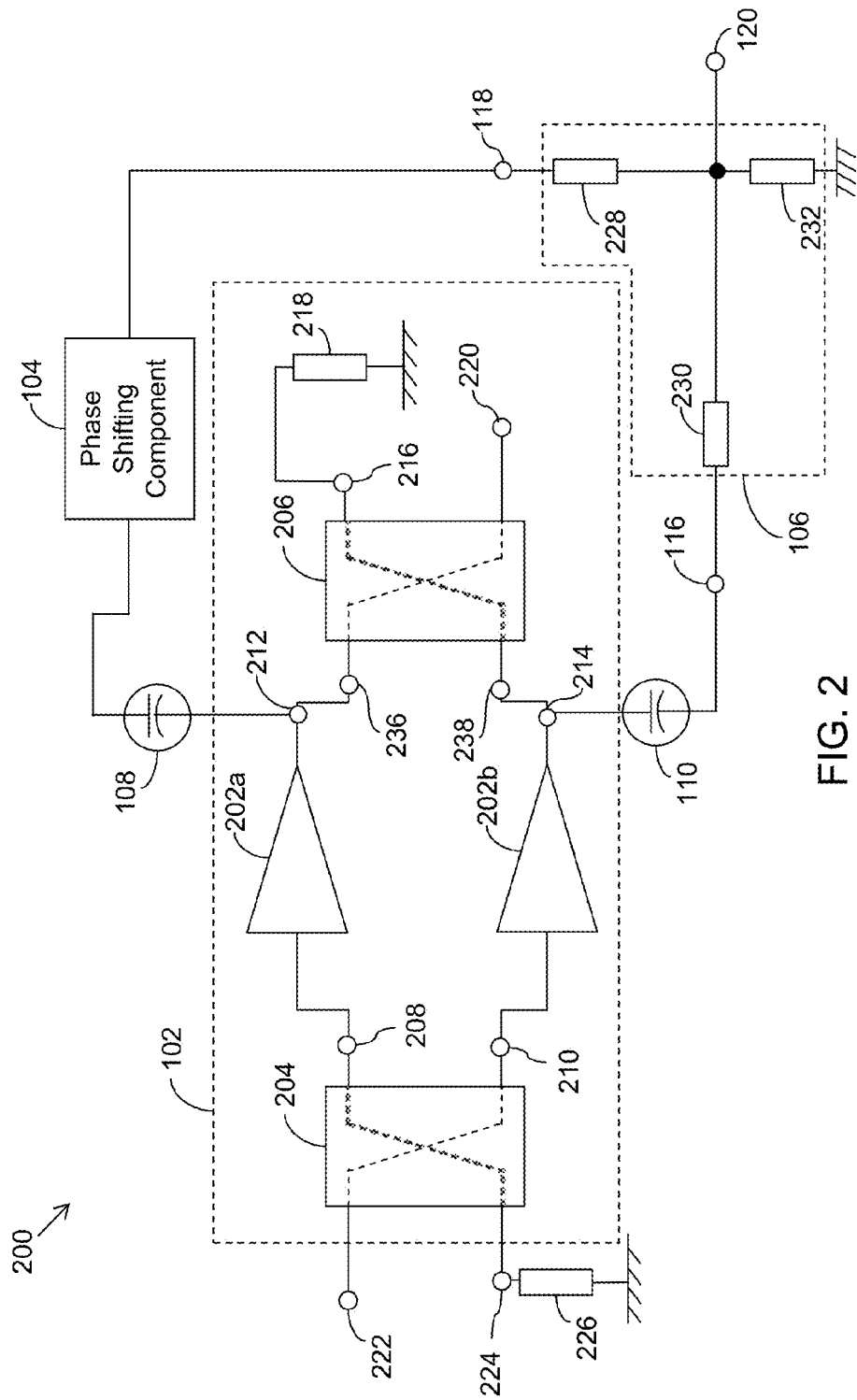
FIG. 2 is a block diagram of an RF amplifying system in accordance with another embodiment.

FIG. 2 is a block diagram of an RF amplifying system 200 in accordance with another embodiment. The RF amplifying system 200 includes various elements in the RF amplifying system 100 (refer to FIG. 1). Quadrature combined amplifier 102 includes a first amplifying device such as an amplifier 202a, a second amplifying device such as an amplifier 202b, a first quadrature coupler 204, a second quadrature coupler 206, and a resistor 218. Coupling network 106 includes a resistor 228, a resistor 230, and a resistor 232.

First quadrature coupler 204 has four terminals (222, 224, 208, and 210). Similarly, second quadrature coupler 206 also has four terminals (236, 238, 216, and 220). Various examples of quadrature couplers, such as, first quadrature coupler 204 and second quadrature coupler 206, include, but are not limited to coupled transmission lines, a branch-line coupler, a micro-strip "3-dB" coupler, a strip-line broadside coupler, a Lange coupler, such as, MLANG, and the like. In an embodiment, first quadrature coupler 204 and second quadrature coupler 206 are 3-dB Lange couplers. In first quadrature coupler 204, terminal 222 corresponds to an input terminal, terminal 224 corresponds to an isolated terminal, terminal 208 corresponds to a coupled terminal, and terminal 210 corresponds to a through terminal. Further, it is apparent to a person of ordinary skill in the art that a signal at terminal 210 is ninety degree out of phase with reference to a signal at terminal 208.

An RF input signal is applied at terminal 222 of first quadrature coupler 204. Terminal 224 is grounded (terminated) through resistor 226. Terminal 208 is connected to an input terminal of amplifier 202a and terminal 210 is connected to an input terminal of amplifier 202b. A first output terminal 212 of amplifier 202a is connected to terminal 236 (corresponds to a through terminal) of second quadrature coupler 206. Similarly, a second output terminal 214 of amplifier 202b is connected to terminal 238 (corresponds to coupled terminal) of second quadrature coupler 206. Terminal 216 (corresponds to an isolated terminal) of second quadrature coupler 206 is grounded (terminated) through resistor 218. An RF output is obtained at terminal 220. Various examples of the amplifying devices, such as, amplifier 202a and amplifier 202b, include, but not limited to any amplifier that includes a transistor, such as, a bipolar junction transistor (BJT), or field effect transistor (FET), gallium arsenide HBT, MESFET, pHEMPT, etc, gallium nitride FET, and the like.

First output terminal 212 of amplifier 202a is connected to the first terminal of phase shifting component 104 through first coupling capacitor 108. The second terminal of phase shifting component 104 is connected to second terminal 118 of coupling network 106 (shown as a dotted line shape). Second output terminal 214 of amplifier 202b is connected to first terminal 116 of coupling network 106 through second coupling capacitor 110.

First terminal 116 is connected to third terminal 120 through resistor 230. Second terminal 118 is connected to third terminal 120 through resistor 228. Third terminal 120 is grounded through resistor 232. It is apparent to a person of ordinary skill in the art that coupling network 106 may also include more than three resistive elements connected in a suitable fashion to obtain the RF coupled output without limiting the scope of the invention. In an embodiment, coupling network includes one or more impedance elements.

The RF input signal applied at terminal 222 is divided into an in-phase component and an out-of-phase component at terminal 208 and terminal 210, respectively. The RF signals at terminals (208, 210) are amplified by amplifiers (202a, 202b). An amplified output RF signal at second output terminal 214 is ninety degree out of phase with respect to an amplified output RF signal at first output terminal 212. Further, an RF output signal of quadrature combined amplifier 102 is obtained at terminal 220.

Phase shifting component 104 provides a ninety degree phase shift to the amplified output RF signal appearing at first output terminal 212. The phase shifted RF signal is available at the second terminal of phase shifting component 104. As discussed earlier, the amplified output RF signal at second output terminal 214 is ninety degree out of phase with respect to an amplified output RF signal at first output terminal 212. Coupling network 106 combines the phase shifted RF signal from phase shifting component 104 and the amplified output RF signal at second output terminal 214. Thus, the RF coupled output is obtained at third terminal 120 of coupling network 106.

In an embodiment, RF input signal of magnitude one volt and phase zero (1, 0°) is applied at terminal 222. Further, Table-1 illustrates the relative magnitude and phase of RF forward voltages at different terminals in FIG. 2 in accordance with an embodiment.

TABLE 1

| Terminal | 222 | 208 | 210 | 224 | 216 | 212 | 214 | 220 | 120 |
|---|---|---|---|---|---|---|---|---|---|
| Voltage, phase | 1, 0° | 0.707, 0° | 0.707, −90° | 0 | 0 | A, 0° | A, −90° | 1.414, −90° | K, −90° |

Where,

'A' denotes amplitude of an RF signal at first output terminal 212 and second output terminal 214 assuming amplifiers 202a and 202b are identical and having the same gain value.

'K' denotes amplitude of an RF signal at third terminal 120 of coupling network 106. In an embodiment, the value of 'K' depends on the values of resistors 228, 230, and 232. In another embodiment, the value of 'K' depends on the values of coupling capacitors 108 and 110, and of resistors 228, 230, and 232.

It is observed from the Table-1 that the RF coupled output at third terminal 120 of coupling network 106 is proportional to the RF output of quadrature combined amplifier 102 at terminal 220.

Table-2 illustrates the relative magnitude and phase of RF reflected voltages at different terminals in FIG. 2 in accordance with an embodiment. For simplicity of the ongoing description, voltage (1, 0°) is assumed at terminal 220 to calculate reflected voltages at other terminals and amplifiers 202a and 202b have identical electrical properties.

TABLE 2

| Terminal | 212 | 214 | 220 | 120 |
|---|---|---|---|---|
| Voltage | 0.707, −90° | 0.707, 0° | 1, 0° | 0 |

It is observed from Table-2 that no reflected voltage appears at third terminal 120, hence, RF coupled output with directivity is obtained. This is further explained in conjunction with FIG. 3.

In an embodiment, a load resistor (hereinafter referred to as a load RL) may be connected at terminal 220. Further, the RF input signal to terminal 222 may be provided from an RF voltage source. Further, Table-3 discloses various exemplary elements and corresponding values of various parameters of the elements of FIG. 2 in accordance with an embodiment.

TABLE 3

| Elements | Element Type | Parameter | Value |
|---|---|---|---|
| First quadrature coupler 204 | Micro-strip Lange Coupler (MLANG) | Width (W) | 2 mil |
| | | Gap (S) | 2 mil |
| | | Length (L) | 30 mm |
| Second quadrature coupler 206 | Micro-strip Lange Coupler (MLANG) | Width (W) | 2 mil |
| | | Gap (S) | 2 mil |
| | | Length (L) | 30 mm |
| First coupling capacitor 108 | Capacitor | Capacitance | 0.35 pF |
| Second coupling capacitor 110 | Capacitor | Capacitance | 0.35 pF |
| Phase shifting component 104 | Transmission line | Impedance | 50 Ohm |
| | | Frequency | 0.8365 GHz |
| | | Phase shift | 90 degree |
| Resistor 228 | Resistor | Resistance | 50 Ohm |
| Resistor 230 | Resistor | Resistance | 50 Ohm |
| Resistor 232 | Resistor | Resistance | 50 Ohm |
| Resistor 218 | Resistor | Resistance | 50 Ohm |
| Resistor 226 | Resistor | Resistance | 50 Ohm |
| Load RL | External System Load | Resistance | 50 Ohm |
| The RF voltage source | Voltage Source | Internal Impedance | 50 Ohm |
| | | Frequency range | RF |

It is apparent to a person of ordinary skill in the art that suitable elements with values other than the values shown in the table above may also be used without departing from the scope of the ongoing description.

Figure 3A:
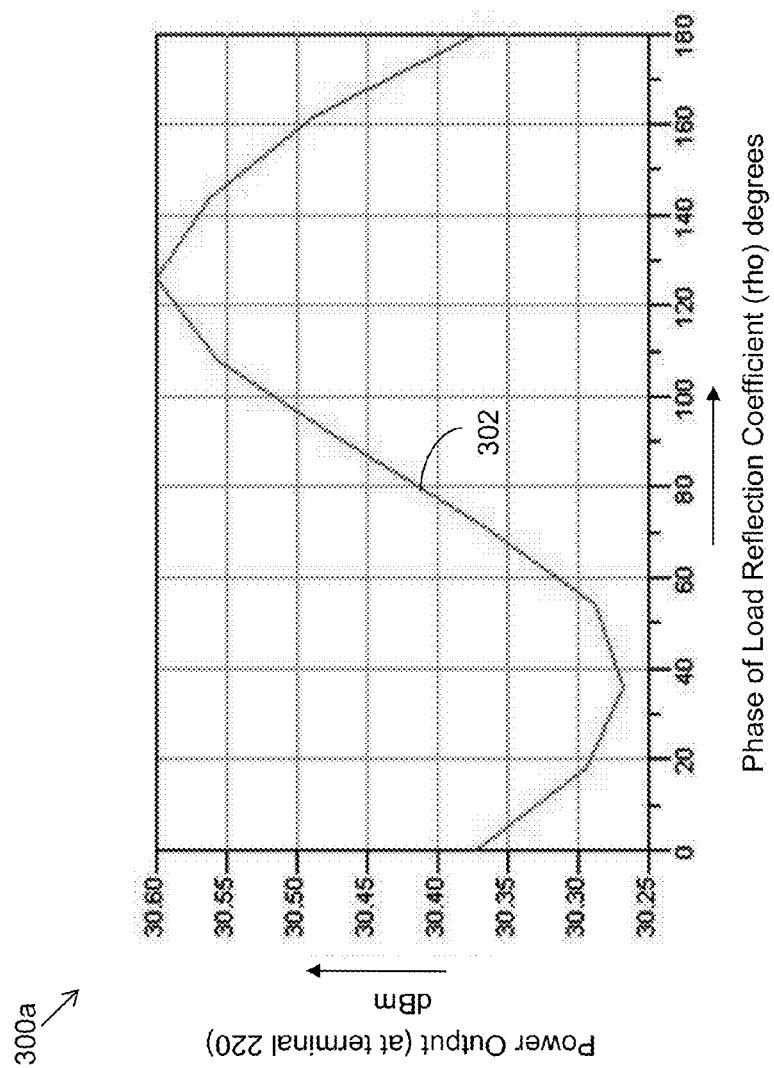
FIG. 3a is a graphical representation depicting the power output of a quadrature combined amplifier with varying load impedance (load-pull) in accordance with an embodiment.
Figure 3B:
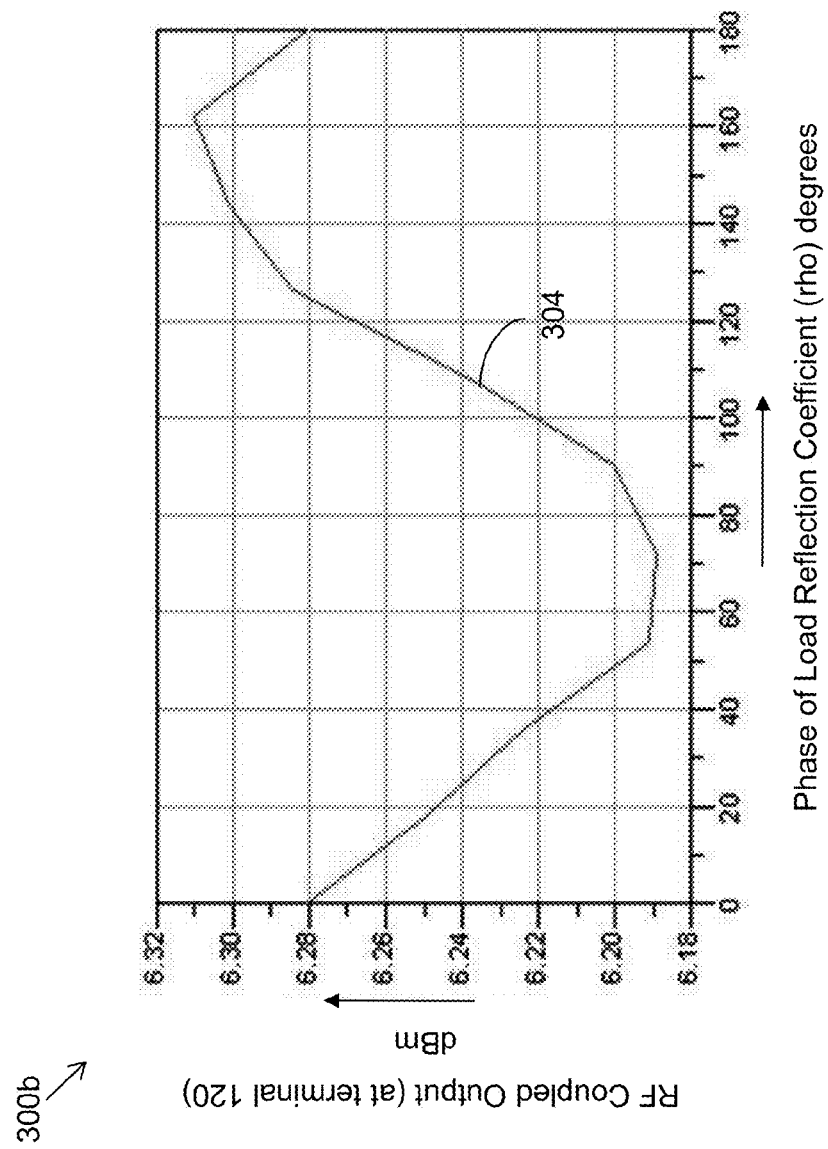
FIG. 3b is a graphical representation depicting an RF coupled output with varying load impedance (load-pull) in accordance with an embodiment.
Figure 3C:
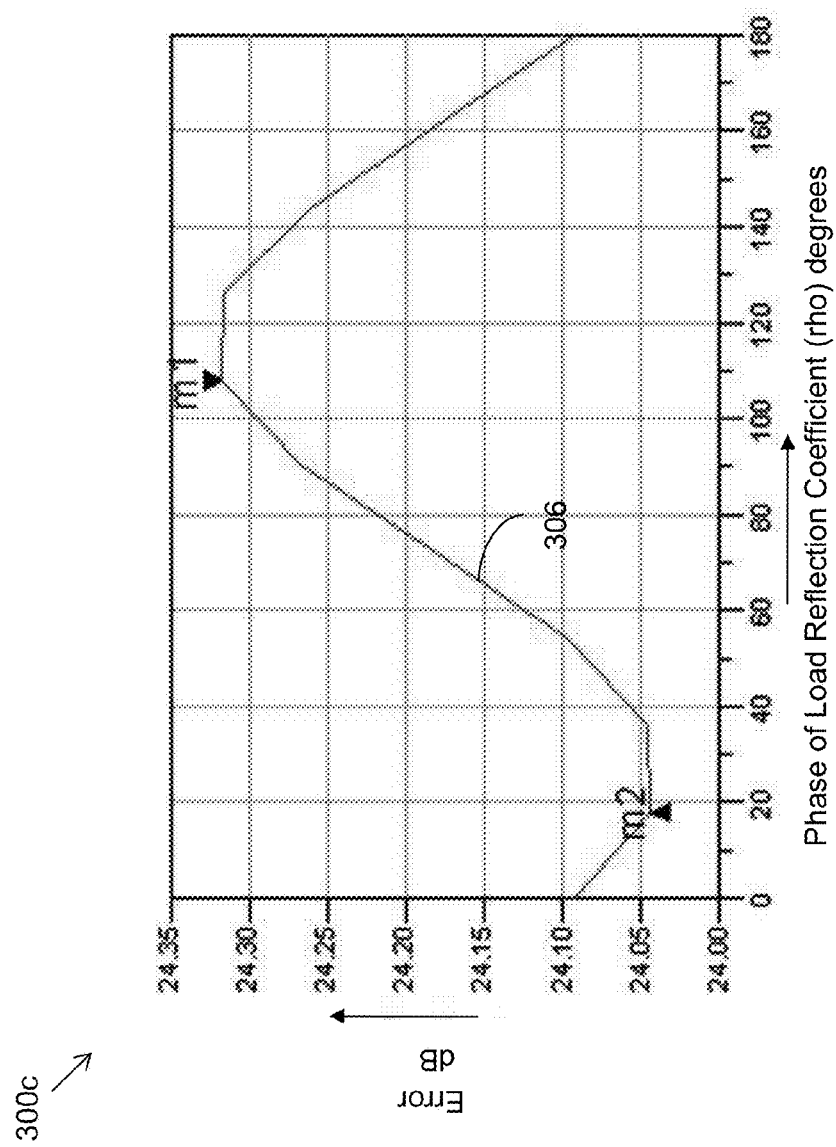
FIG. 3c is a graphical representation depicting the difference in the power output of the quadrature combined amplifier and the RF coupled output with varying load impedance (load-pull) in accordance with an embodiment.

FIGS. 3a, 3b, and 3c are graphical representations 300a, 300b, and 300c depicting power output at various terminals in FIG. 2 with specific values of parameters of the elements in conjunction with Table-3.

FIG. 3a is a graphical representation 300a depicting a power output of a quadrature combined amplifier with varying load impedance (load-pull) in accordance with an embodiment.

In graphical representation 300a, the vertical axis represents the output power on a logarithmic scale. The horizontal axis represents the phase ϕ (in degrees) of the load reflection coefficient (rho) varied all phases from magnitude=0.429, phase=0° (corresponding to Load RL=125 Ohms real) to magnitude=0.429, phase=180° (corresponding to Load RL=20 Ohms real). The output load impedance (Load RL) is varied with a constant VSWR of 2.5:1 all phases or a return loss of about 7.36 dB. The change in the output load impedance (Load RL) results in to the change in the phase ϕ. A curve 302 depicts various values of an RF power at terminal 220 of second quadrature coupler 206, for different values of the phase ϕ.

FIG. 3b is a graphical representation 300b depicting an RF coupled output with varying load impedance (load-pull) in accordance with an embodiment. In graphical representation 300b, the vertical axis represents the RF coupled output on a logarithmic scale. The horizontal axis represents the phase ϕ (in degrees) of the load reflection coefficient (rho) varied all phases from magnitude=0.429, phase=0° (corresponding to Load RL=125 Ohms real) to magnitude=0.429, phase=180° (corresponding to Load RL=20 Ohms real). The output load impedance (Load RL) is varied with a constant VSWR of 2.5:1 all phases or a return loss of about 7.36 dB. The change in the output load impedance (Load RL) results in to a change in the phase ϕ. A curve 304 depicts various values of an RF power at an output of coupling network 106, i.e. at third terminal 120 of coupling network 106, for different values of the phase ϕ.

Further, the load reflection coefficient (rho) is explained below, during the calculation of directivity, in conjunction with FIG. 3c.

It is seen from FIG. 3a and FIG. 3b that curve 304 closely resembles curve 302, i.e. the RF coupled output is proportional to the power output of quadrature combined amplifier 102.

FIG. 3c is a graphical representation 300c depicting the difference in the quadrature combined amplifier 102 output and the RF coupled output with varying load impedance (load-pull) in accordance with an embodiment. In graphical representation 300c, the vertical axis represents error values on a logarithmic scale. As explained earlier, the horizontal axis represents the phase ϕ (in degrees) of the load reflection coefficient (rho). A curve 306 represents difference or error in the power output of quadrature combined amplifier 102 (at terminal 220) and coupling network 106 (at third terminal 120) for different values of the phase ϕ. As disclosed earlier, curve 306 is based on specific values of parameters of the elements in conjunction with Table-3.

In an embodiment, the error may be due to signal losses or signal reflections due to various elements of FIG. 2 as listed in Table-3. In accordance with an embodiment, the value of error is about 0.137 dB.

In an embodiment, in conjunction with Table-3, directivity of the RF coupled output may be approximately calculated using following equation:

$$\text{Directivity} = -20 \, \text{LOG}(10^{(dBErr/20)} - 1) - dBRL$$

Where, dBErr=0.137; and
dBRL may be calculated using following equations:

$$dBRL = -20 \, \text{LOG}(rho)$$

Where, rho is the reflection coefficient. In an embodiment of the invention, the value of rho may be calculated approximately using following formula:

$$rho = \text{MAG}((\text{Load RL} - 50)/(\text{Load RL} + 50))$$

Based on the above equation, for Load RL=20 Ohm (real), the value of rho is 0.429. Further, for Load RL=125 Ohm (real), the value of rho is 0.429.

In conjunction with above equations and Load RL=20 Ohms, the values of Directivity, dBRL, and dBErr is shown in a Table-4.

TABLE 4

| Directivity | dBRL | dBErr |
|---|---|---|
| 28.61 | 7.35 | 0.137 |

It is observed that the RF coupled output with directivity 28.61 is obtained at terminal third 120 of coupling network in the disclosed embodiment.

The embodiments of the invention provide several advantages. The coupling network according the embodiments of the invention provides the RF coupled output with directivity. The requirement of an additional directional coupler can be avoided hence reducing the overall cost and the size of the RF amplifying system. In an embodiment of invention, the coupling network includes a network of resistors which further reduces an overall weight of the RF amplifying system.

While various embodiments have been illustrated and described, it will be clear that the invention is not limited to these embodiments only. Numerous modifications, changes, variations, substitutions and equivalents will be apparent to those skilled in the art, without departing from the scope and spirit of the invention, as described in the claims that follow.

What is claimed is:

1. A radio frequency (RF) coupling circuit for coupling an RF output of a quadrature combined amplifier, the RF coupling circuit comprising:
a phase shifting component comprising a first terminal and a second terminal, the phase shifting component is configured to provide a predetermined phase shift to a first RF signal at the first terminal and provide a phase shifted first RF signal at the second terminal, wherein the first terminal of the phase shifting component is configured to receive the first RF signal from a first output terminal of a first amplifier in the quadrature combined amplifier; and
a coupling network configured to provide an RF coupled output, the coupling network comprising a first terminal, a second terminal, and a third terminal, wherein the first terminal of the coupling network is configured to receive a second RF signal from a second output terminal of a second amplifier in the quadrature combined amplifier, wherein the second terminal of the coupling network is configured to receive the phase shifted first RF signal from the second terminal of the phase shifting component, wherein the RF coupled output is provided at the third terminal of the coupling network, and wherein the quadrature combined amplifier includes:
a first quadrature coupler connected to a first input terminal of the first amplifier and a second input terminal of the second amplifier, and
a second quadrature coupler connected to the first output terminal of the first amplifier and the second output terminal of the second amplifier.

2. The RF coupling circuit of claim 1, wherein the phase shifting component is at least one of: a transmission line, an all pass filter, one or more inductive elements, and one or more capacitive elements.

3. The RF coupling circuit of claim 1, wherein the predetermined phase shift is ninety degrees.

4. The RF coupling circuit of claim 1, wherein the first terminal of the phase shifting component is configured to receive the first RF signal from the first output terminal through a first coupling capacitor.

5. The RF coupling circuit of claim 1, wherein the first terminal of the coupling network is configured to receive the second RF signal from the second output terminal through a second coupling capacitor.

6. The RF coupling circuit of claim 1, wherein the coupling network comprises one or more resistors.

7. The RF coupling circuit of claim 1, wherein the first terminal of the coupling network is connected to the third terminal of the coupling network through a first resistor.

8. The RF coupling circuit of claim 1, wherein the second terminal of the coupling network is connected to the third terminal of the coupling network through a second resistor.

9. The RF coupling circuit of claim 1, wherein the third terminal of the coupling network is grounded to through a third resistor.

10. A radio frequency (RF) amplifying system comprising:
a first amplifier, the first amplifier comprising a first input terminal and a first output terminal;
a second amplifier, the second amplifier comprising a second input terminal and a second output terminal;
a first quadrature coupler connected to the first input terminal and the second input terminal;
a second quadrature coupler connected to the first output terminal and the second output terminal;
a phase shifting component comprising a first terminal and a second terminal, the phase shifting component providing a predetermined phase shift to a first RF signal at the first output terminal, the first terminal of the phase shifting component being connected to the first output terminal, a phase shifted first RF signal being provided at the second terminal of the phase shifting component; and
a coupling network for obtaining an RF coupled output, the coupling network comprising a first terminal, a second terminal, and a third terminal, the first terminal of the coupling network receiving a second RF signal from the second output terminal, the second terminal of the coupling network receiving the phase shifted first RF signal from the second terminal of the phase shifting component, the RF coupled output being provided at the third terminal of the coupling network.

11. The RF amplifying system of claim 10, wherein an RF signal at the second input terminal is phase shifted ninety degrees with respect to an RF signal at the first input terminal.

12. The RF amplifying system of claim 10, wherein the phase shifting component is at least one of: a transmission line, an all pass filter, one or more inductive elements, and one or more capacitive elements.

13. The RF amplifying system of claim 10, wherein the predetermined phase shift is ninety degrees.

14. The RF amplifying system of claim 10, wherein the first terminal of the phase shifting component is connected to the first output terminal through a first coupling capacitor.

15. The RF amplifying system of claim 10, wherein the first terminal of the coupling network being connected to the second output terminal through a second coupling capacitor.

16. The RF amplifying system of claim 10, wherein the coupling network comprises one or more resistors.

17. The RF amplifying system of claim 10, wherein the first terminal of the coupling network is connected to the third terminal of the coupling network through a first resistor.

18. The RF amplifying system of claim 10, wherein the second terminal of the coupling network is connected to the third terminal of the coupling network through a second resistor.

19. The RF amplifying system of claim 10, wherein the third terminal of the coupling network is grounded to through a third resistor.

* * * * *